July 1, 1969 R. B. DUNKLE 3,453,501

METALLIZATION OF SILICON SEMICONDUCTOR DEVICES FOR MAKING OHMIC CONNECTIONS THERETO

Filed Aug. 10, 1966

INVENTOR.
RICHARD B. DUNKLE
BY
Frank D Prager
ATTORNEY 3,453,501

METALLIZATION OF SILICON SEMICONDUCTOR DEVICES FOR MAKING OHMIC CONNECTIONS THERETO

Richard B. Dunkle, Forest Grove, Pa., assignor to Philco-Ford Corporation, Philadelphia, Pa., a corporation of Delaware Filed Aug. 10, 1966, Ser. No. 571,454
Int. Cl. H01l 1/14
U.S. Cl. 317—234 3 Claims

ABSTRACT OF THE DISCLOSURE

A semiconductive silicon body is metallized so that connector wires can be soldered thereto. A thin film of aluminum is first vapor deposited and sintered on the silicon body. A thin film of silver is then vapor deposited and sintered on the body. The body is then coated with nickel by electroless deposition.

This invention relates to a surface-metallizing method for the fabrication of large area contacts on transistors and the like. A body of semiconductive material, especially silicon, is to be connected electrically to a whisker wire, and it is for this purpose that the surface is metallized.

It is a primary object of the invention to provide metallization of the silicon surface in such a way as to insure mechanically strong adherence and electrically high conductance of the metallic film whereto the wire is to be attached. It is a further object to conduct the process so that the resulting semiconductor device can withstand high temperature storage and other adverse conditions without peeling off of the film. It is still another object to produce strong and highly conductive contacts which are uniformly reproducible.

Toward the indicated objects the invention provides a metallizing method which begins with vapor-deposition and subsequent sintering of a "thin film" of aluminum on the silicon substrate, continues with vapor-deposition and sintering of a somewhat similar film of silver, and is completed by over-coating the unit with oxygen-resistive and readily solderable metal, such as electroless nickel. The depositing and sintering of aluminum and silver produces thin film elements of largely inter-penetrating character and which firmly adhere to the silicon surface, thereby providing a uniquely strong and conductive substrate for the nickel coating and the solder contacts thereon. Additionally the silver film readily accepts a highly adherent nickel plate and protects the aluminum film from the corrosive action of the electroless nickel plating solution.

Figure 1:
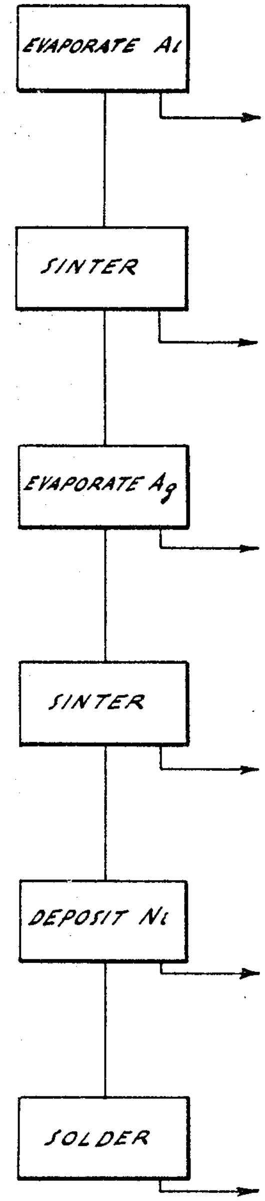

The complete process is indicated in the block diagram of FIGURE 1, and the conditions of a semiconductor blank, achieved by successive stages of the process, are schematically illustrated in FIGURES 2 to 7.

Figure 2:
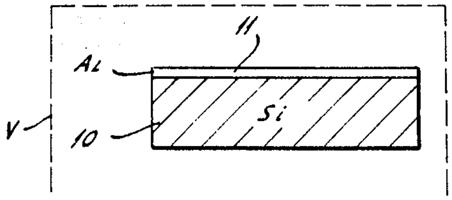

Referring initially to FIGURES 1 and 2, aluminum (Al) is evaporated in a vacuum jar V which contains body 10 of silicon (Si). The vapor is caused to form a "thin film" 11 of aluminum condensate on body 10. The operation is desirably carried out under a high vacuum, for instance under a pressure of only $10^{-6}$ torr maintained in the jar. The illustration of silicon body 10 and film 11, in the appended drawing, is highly diagrammatic. While the width and diameter of the silicon body may be similar to that indicated in the drawing, the thickness thereof is very minor. For instance, typically the wafer has a hundred fifty microns thickness. Film 11 is deposited only to a nominal thickness such as 1500 angstrom units. While shown as a flat layer, this film actually adheres to a silicon surface of more complex grain and constitution, the details of which need not be discussed herein.

Figure 3:
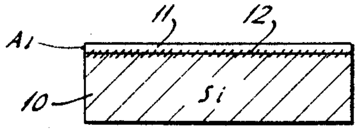

Referring next to FIGURES 1 and 3: film 11 is bonded to silicon body 10 by sintering, for which purpose this body, with the film thereon, is exposed to a temperature high enough to establish a strong and highly conductive bond but not high enough to cause melting of the materials. Advantageously the temperature during the sintering process is maintained slightly below 577° C., the eutectic temperature of silicon-aluminum, and more specifically at about 560° C.

The sintering process is conducted promptly after the deposition of the aluminum and in such a way as to avoid intermediate contact of the surface with oxygen and the like, in order to minimize formation of films of aluminum oxide. For this purpose it is preferable to perform the sintering in the same vacuum jar V in which the aluminum has been evaporated and deposited, and also to use this same jar for the next following step.

Figure 4:
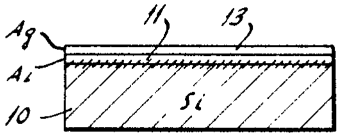
Figure 5:
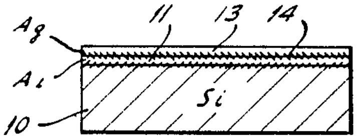
Figure 6:
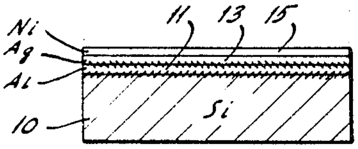
Figure 7:
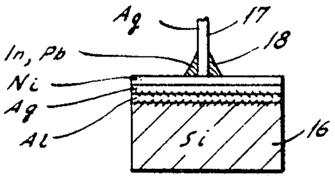

As indicated by FIGURE 4, silver (Ag) is vapor-deposited onto film 11, as a superimposed thin film 13. This again is done promptly, and desirably in the same jar or space V, FIGURE 1. The deposition of the silver film, desirably to a nominal thickness of a few hundred or a few thousand angstrom units, is promptly followed, FIGURES 1 and 5, by a further sintering step desirably carried out in the same area V. This further sintering step is conducted at a temperature of about 550° C., preferably below not far below the eutectic temperature of aluminum and silver. If care is taken to insure that silver is present in amount insufficient to dissolve all the aluminum, it is possible to exceed the eutectic temperature without damage. A strong bond 14, probably involving some solid state diffusion is formed thereby between the aluminum and the silver, as large portions of the silver are soluble in the aluminum at such a temperature.

As already indicated, the thickness of "thin films" 11, 13 are greatly exaggerated in the drawing. The same remark applies to the thickness of final nickel coat 15, FIGURE 6, which is desirably formed by electroless coating, thereby employing an alkaline nickel bath. When the unit has been metallized in this way it is desirably broken into smaller units or chips 16, FIGURE 7. Whisker wire 17, for instance of silver (Ag), is then attached to the metallized body by suitable solder 18, for instance of lead (Pb) and indium (In), as indicated. In such case no solder flux is generally required. However, where fluxing of the solder joint is desirable, the use of an ambient atmosphere of hydrogen gas during soldering has proven effective. Temperatures of several hundred degrees centigrade can be used for such soldering, without harm to the semiconductive device.

The device produced by the new method has been found to be highly effective. Pull tests show that the bond produced between the whisker wire and the metallized silicon surface is stronger than the whisker wire. Numerous temperature cycles between +200° and −85° C. have been applied to the devices, without failure of the devices. When a number of devices made in accordance with the new method were tested there was found, as to reproducibility, 90% uniformity as to the advantageous characteristics of the solder joints.

I claim:

1. A process of metallization of silicon for connection of the silicon with a metallic wire, comprising the consecutive steps of:
vapor-depositing a thin film of aluminum on the silicon;
sintering the same at about 560° C.;
vapor-depositing a thin film of silver thereon;
sintering the product at about 550° C.; and
overcoating the product by electroless deposition of nickel.

2. A process in accordance with claim 1 wherein the aluminum is deposited to a nominal thickness of about 1500 angstrom units.

3. A semiconductive device comprising a body of silicon; a thin film of aluminum closely adhereing to the grain and configuration of the silicon; a thin film of silver superimposed on that of aluminum; and a coating of nickel on said thin film of silver.

References Cited

UNITED STATES PATENTS

| | | | |
|---|---|---|---|
| 2,801,375 | 7/1957 | Losco. | |
| 2,969,296 | 1/1961 | Walsch | 117—212 |
| 3,253,951 | 5/1966 | Marinaccio et al. | 117—212 |

ALFRED L. LEAVITT, *Primary Examiner.*

C. K. WEIFFENBACH, *Assistant Examiner.*

U.S. Cl. X.R.

29—195, 197, 199; 117—62, 71, 107, 217, 227